(12) United States Patent
Bai et al.

(10) Patent No.: US 10,027,326 B2
(45) Date of Patent: Jul. 17, 2018

(54) RECONFIGURABLE CIRCUIT

(71) Applicant: NEC CORPORATION, Tokyo (JP)

(72) Inventors: Xu Bai, Tokyo (JP); Yukihide Tsuji, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/531,816

(22) PCT Filed: Jan. 21, 2015

(86) PCT No.: PCT/JP2015/052246
§ 371 (c)(1),
(2) Date: May 31, 2017

(87) PCT Pub. No.: WO2016/117134
PCT Pub. Date: Jul. 28, 2016

(65) Prior Publication Data
US 2017/0331480 A1 Nov. 16, 2017

(51) Int. Cl.
*H03K 19/173* (2006.01)
*H03K 19/094* (2006.01)
(Continued)

(52) U.S. Cl.
CPC ... *H03K 19/09429* (2013.01); *H01L 27/2436* (2013.01); *H03K 19/1737* (2013.01); *H03K 19/17744* (2013.01); *H03K 19/17748* (2013.01)

(58) Field of Classification Search
CPC ......... H03K 19/09429; H03K 19/1733; H03K 19/1736; H03K 19/1737; H03K 19/17704;
(Continued)

(56) References Cited

U.S. PATENT DOCUMENTS 6,097,212 A * 8/2000 Agrawal ............ H03K 19/1737
326/38
6,529,040 B1 * 3/2003 Carberry ............ H03K 19/1737
326/40
(Continued)

FOREIGN PATENT DOCUMENTS

JP 2006-339395 A 12/2006
WO 2010/106876 A1 9/2010

OTHER PUBLICATIONS

Peter Jamieson et al., "Enhancing the Area-Efficiency of FPGAs with Hard Circuits Using Shadow Clusters", IEEE Transactions on Very Large Scale Integration (VLSI) Systems, Dec. 2010, pp. 1696-1709, vol. 18, No. 12.
(Continued)

*Primary Examiner* — Jason M Crawford
(74) *Attorney, Agent, or Firm* — Sughrue Mion, PLLC

(57) ABSTRACT

The invention is to provide a compact reconfigurable circuit implementing a LUT and a "hard" circuit. The present invention provides a reconfigurable circuit comprising: first wires disposed in a first direction; a second wire disposed in a second direction intersecting the first direction; a power line, a ground line and data input line or data input inverse line coupled to the said first wires one-to-one; a multiplexer, one of whose inputs is connected with the second wire; nonvolatile switch cells utilized to interconnect the first wires and second wire at the crosspoints, wherein every nonvolatile switch cell is constructed by at least one nonvolatile resistive switch.

13 Claims, 11 Drawing Sheets

(51) Int. Cl.
*H03K 19/177* (2006.01)
*H01L 27/24* (2006.01)
(58) Field of Classification Search
CPC ..... H03K 19/17744; H03K 2217/0054; H03K 3/356052; H03K 3/356147
See application file for complete search history.

(56) References Cited

U.S. PATENT DOCUMENTS

| | | | |
|---|---|---|---|
| 7,019,557 B2 | 3/2006 | Madurawe | |
| 7,411,424 B2* | 8/2008 | Li | H03K 19/0948 326/106 |
| 7,796,423 B2* | 9/2010 | Sugiyama | H03K 19/1733 326/113 |
| 8,760,193 B2* | 6/2014 | Voogel | H03K 19/17744 326/38 |
| 8,816,312 B2 | 8/2014 | Tada et al. | |
| 2005/0035783 A1* | 2/2005 | Wang | H03K 19/1736 326/39 |
| 2010/0271068 A1* | 10/2010 | Feng | H03K 19/1737 326/53 |
| 2010/0291749 A1* | 11/2010 | Or-Bach | G11C 17/14 438/401 |
| 2012/0212995 A1* | 8/2012 | Kurokawa | G11C 7/1006 365/149 |
| 2013/0257477 A1* | 10/2013 | Yasuda | H03K 19/17748 326/38 |
| 2014/0339540 A1* | 11/2014 | Takemura | H01L 27/1225 257/43 |

OTHER PUBLICATIONS

Xu Bai et al., "Implementation of Voltage-Mode/Current-Mode Hybrid Circuits for a Low-Power Fine-Grain Reconfigurable VLSI", IEICE Transactions on Electronics, pp. 1028-1035, vol. E97-C, No. 10; Oct. 2014.
Shunichi Kaeriyama et al., "A Nonvolatile Programmable Solid-Electrolyte Nanometer Switch", IEEE Journal of Solid-State Circuits, Jan. 2005, pp. 168-176, vol. 40, No. 1.
International Search Report for PCT/JP2015/052246 dated Apr. 7, 2015.

* cited by examiner

| State of $m_x$ | State 0 | State 1 |
|---|---|---|
| Output | Vdd | Gnd |

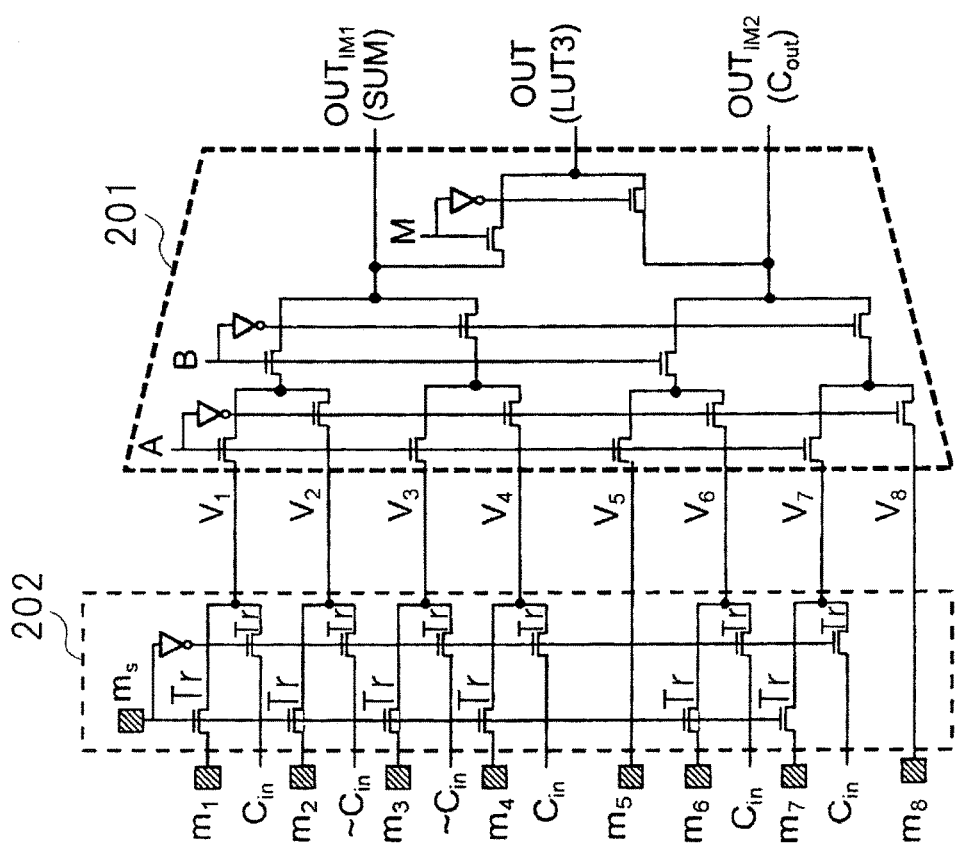

| State of $M_n$ | State 0 | State 1 | State 2 |
|---|---|---|---|
| Output | Vdd | Gnd | Z |

Transistor count of FA-type 3-input LUTs

| | Conventional | 1T1R-NVSC-based | 0T1R/1T1R-mixed-NVSC-based | 1T2R-NVSC-based | 0T2R/1T2R-mixed-NVSC-based |
|---|---|---|---|---|---|
| MUX input switch block | 18 | 6 | 0 | 6 | 0 |
| Total | 88 | 62 | 56 | 58 | 52 |

Fig. 10

RECONFIGURABLE CIRCUIT

CROSS REFERENCE TO RELATED APPLICATIONS

This application is a National Stage of International Application No. PCT/JP2015/052246 filed Jan. 21, 2015, the contents of all of which are incorporated herein by reference in their entirety.

TECHNICAL FIELD

This invention is about a reconfigurable circuit using non-volatile resistive switches.

BACKGROUND ART

Field-programmable gate arrays (FPGAs) are widely used for low- and medium-volume chips, but they have failed dominate over the high-volume market, because of their high cost which results from a large silicon area of the device. The most common FPGA architecture consists of an array of logic blocks (LBs), I/O pads, and routing channels. In the LB, look-up table (LUT) is used as a "soft" function generator to realize various functions, which leads to very high functionality but causes large area of the device. It has been shown that a simple look-up table (LUT)/flip-flop (FF) FPGA requires about 35 times the area of a cell-based application-specific integrated circuit (ASIC). To narrow this gap, frequently used dedicated "hard" circuits such as carry chains, adders and multipliers have been employed in FPGA design as shown in the non-patent document 1.

The "soft" LUT is conventionally constructed by a multiplexer (MUX), while a "hard" circuit can also be constructed by a MUX if pass transistor logic (PTL) is used. The "hard" circuits are very efficient when they are used. Otherwise, they are wasted. To overcome the negative impact of the "hard" circuit, concept of sharing common MUX to implement "soft" and "hard" circuits has been introduced in the non-patent document 2.

As shown in FIG. 1A, a $2^n$:1 MUX 101 is shared to construct a reconfigurable circuit to implement a LUT and a "hard" circuit. A MUX input switch block 102 selects either a memory value or a data input (or its inverse) as the input of the MUX 101 for a LUT mode or a "hard" circuit mode. The MUX input switch block 102 is composed of a memory $m_s$ and nMOS pass transistors Tr in conventional CMOS technology as shown in patent document 1. The nMOS transistors Tr are connected to the two-state memories $m_1, \ldots, m_{2^n}$ as shown in FIG. 1B. When the $m_s$ is configured as "1", memories $m_1, \ldots, m_{2^n}$ are connected with the $2^n$:1 MUX 101's input ports $V_1, \ldots, V_{2^n}$, so that n-input LUT can be implemented. When the $m_s$ is configured as "0", data input D and its inverse ~D are applied to the $2^n$:1 MUX 101's input ports $V_1, \ldots, V_{2^n}$, so that a "hard circuit" can be implemented. The $2^n$:1 MUX 101 can be efficiently utilized. However, the MUX input switch block 102 causes large area of the device.

As a basic "hard" circuit, a full adder (FA) is used to construct multi-bit adder and multiplier in conventional FPGAs. As shown in FIG. 2A, an 8:1 MUX 201 is shared to implement a 3-input LUT and the FA, which leads to high utilization of the hardware resources. The 8:1 MUX 201 has one output and two intermediate outputs, wherein signals A and B select one input from among inputs $V_1, \ldots, V_4$ as the intermediate $OUT_{IM1}$, signals A and B select one input from among inputs $V_5, \ldots, V_8$ as the intermediate $OUT_{IM2}$, signal M select one of $OUT_{IM1}$ and $OUT_{IM2}$ as a final output OUT. When the $m_s$ is configured as "1", memories $m_1, \ldots, m_8$ are connected with the 8:1 MUX 201's input ports $V_1, \ldots, V_8$, so that 3-input LUT can be implemented. When the $m_s$ is configured as "0", carry input $C_{in}$ and its inverse $\sim C_{in}$ are applied to the 8:1 MUX 201's input ports $V_1, \ldots, V_8$, so that the FA can be implemented according to the truth table shown in FIG. 2B. The MUX input switch block 202 is composed of 12 nMOS transistors Tr and a memory $M_s$ constructed by 6 transistors (if a conventional SRAM is used), which results in large area of the device.

Non-patent document 1: P. A. Jamieson and J. Rose, "Enhancing the area efficiency of FPGAs with hard circuits using shadow clusters," IEEE Transactions on Very Large Scale Integration (VLSI) Systems, vol. 18, no. 12, pp. 1696-1709, December 2010.

Non-patent document 2: X. BAI, M. KAMEYAMA, Implementation of Voltage-Mode/Current-Mode Hybrid Circuits for a Low-Power Fine-Grain Reconfigurable VLSI, IEICE TRANSACTIONS on Electronics, Vol. E97-C, No. 10, pp. 1028-1035

Non-patent document 3: Shunichi Kaeriyama et al., A Non-volatile Programmable Solid-Electrolyte Nanometer Switch, IEEE Journal of Solid-State Circuits, January 2005, pp. 168-176, vol. 40, No. 1.

Patent document 1: U.S. Pat. No. 7,019,557
Patent document 2: U.S. Pat. No. 8,816,312

SUMMARY OF THE INVENTION

Problem to be Solved by the Invention

The object of the present invention is to provide a compact reconfigurable circuit implementing a LUT and a "hard" circuit.

The present invention provides a reconfigurable circuit comprising: first wires disposed in a first direction; a second wire disposed in a second direction intersecting the first direction; a power line, a ground line and data input line or data input inverse line coupled to the said first wires one-to-one; a multiplexer, one of whose inputs is connected with the second wire; nonvolatile switch cells utilized to interconnect the first wires and second wire at the crosspoints, wherein every nonvolatile switch cell is constructed by at least one non-volatile resistive switch.

According to the reconfigurable circuit by the present invention, a device having a small area can be realized.

Means for Solving the Problem

BRIEF DESCRIPTION OF THE DRAWINGS

The invention will now be described with reference to the accompanying drawings.

FIG. 2A illustrates a conventional FA-type 3-input LUT implementing a 3-input LUT and the FA.

FIG. 2B shows a truth table of FA in FIG. 2A.

FIG. 10 illustrates transistor count comparison of FA-type 3-input LUTs.

BEST MODE FOR CARRYING OUT THE INVENTION

Embodiment 1

Figures 3A, 3B:
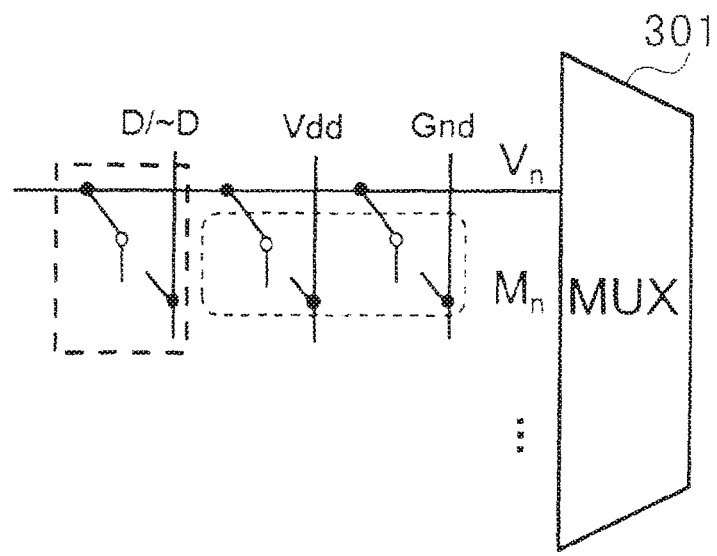
FIG. 3A illustrates a novel nonvolatile-switch-cell (NVSC)-based reconfigurable circuit according to embodiment 1.
FIG. 3B shows an output state of memory $M_n$ in FIG. 3A.

A first exemplary embodiment of the present invention will be described. FIG. 3A illustrates a novel non-volatile-switch-cell (NVSC)-based reconfigurable circuit composed of wires, NVSCs and a MUX 301. First wires are disposed in a first direction, while a second wire is disposed in a second direction intersecting the first direction. Vdd, Gnd, data input D or input inverse ~D are applied to the first wires one-to-one, while the second wire is coupled to one input port $V_n$ of the MUX 301. NVSCs interconnect the first and second wires at the crosspoints. At one crosspoint, one terminal of a NVSC is connected to one of the first wires, while the other one is connected to said second wire.

FIG. 3B shows an output state of memory $M_n$, a tri-state memory $M_n$ is constructed of two NVSCs: one is connected to Vdd and the other one is connected to Gnd. When the NVSC connected to Vdd, it is configured as "ON" and the NVSC that is connected to Gnd is configured as "OFF", $M_n$ provides the Vdd state. When the NVSC connected to Vdd is configured as "OFF" and the NVSC that is connected to Gnd is configured as "ON", $M_n$ provides the Gnd state. When both the NVSCs are configured as "OFF", $M_n$ provides a high impedance state as well. Therefore, the nMOS pass transistors that provide a high impedance state for memories in a conventional reconfigurable circuit can be omitted.

Figures 4A, 4B:
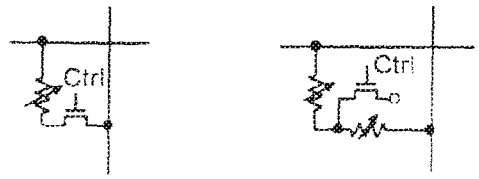
FIG. 4A illustrates a NVSC using 1 transistor 1 non-volatile resistive switch (1T1R) structure.
FIG. 4B illustrates a NVSC using 1 transistor 2 non-volatile resistive switches (1T2R) structure.

The NVSC is constructed of at least one or more non-volatile resistive switches (NVRSs). The NVRS has ON and OFF states, and the ON/OFF resistance ratio is over $10^4$. There are mainly two kinds of NVRS s, one is ReRAM (Resistance Random Access Memory) using the transition metal oxide, the other one is Nano Bridge (registered trademark of NEC Corporation) using the ion conductor. The NVRS is stacked on a CMOS logic circuit, which result in a device having a very small area. As well, non-volatility reduces the stand-by power. Also, its small resistance and capacitance contribute to high speed. FIGS. 4A and 4B illustrate two kinds of NVSC arrays: a 1-transistor 1 NVRS (1T1R) array (FIG. 4A) and a 1-transistor 2 NVRSs (1T2R) NVRC array (FIG. 4B).

Figure 4C:
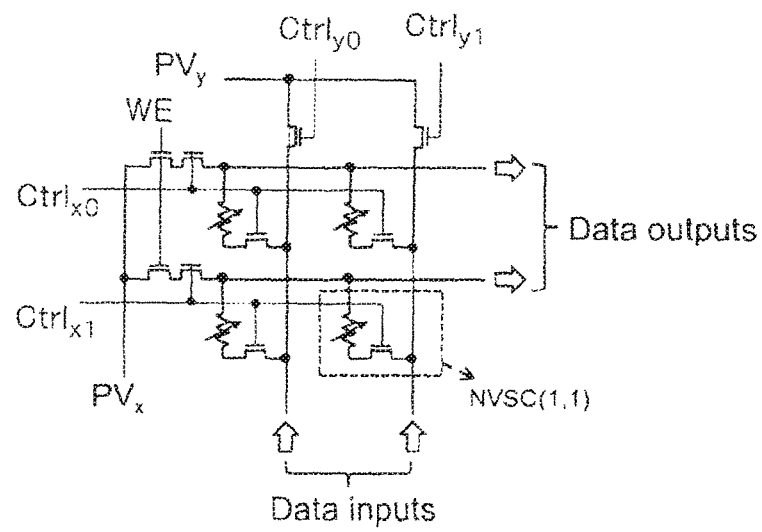
FIG. 4C illustrates a 1T1R-NVSC array.

In the 1T1R-NVSC array shown in FIG. 4C, every 1T1R-NVSC has 2 terminals, where a first terminal is connected to a first wire disposed in a first direction, while a second terminal is connected to a second wire disposed in a second direction intersecting the first direction. One terminal of the NVRS in the 1T1R-NVSC is connected to the source of a transistor whose gate is connected to a control signal $Ctrl_x$, and the drain is connected to the first wire. The transistor works as a switch to access the selected 1T1R-NVSC and to isolate unselected 1T1R-NVSCs for high write reliability as shown in the non-patent document 3. Only when the transistor is switched ON, can the selected 1T1R-NVSC be configured.

The configuration and operation modes of the 1T1R-NVSC array will be discussed as follows. The programming voltages $PV_x$ and $PV_y$ are used to configure NVSCs as "ON" or "OFF". The control signals $Ctrl_x$ and $Ctrl_y$ determine the address of the NVSC to be configured. The write enable signal WE is used to enable the configuration mode. In the configuration mode, for example, in order to program NVSC (1, 1) as "ON", $PV_x$ and $PV_y$ are set to Vset (Set voltage for NVRS) and Gnd, respectively. WE, $Ctrl_{x1}$ and $Ctrl_{y1}$ are set to "1", and $Ctrl_{x0}$ and $Ctrl_{y0}$ are set to "0". Vset and Gnd are applied to the two terminals of the NVSC (1, 1) which can be configured as "ON". On the other hand, if we want to program NVSC (1, 1) as "OFF", $PV_x$ and $PV_y$ are set to Gnd and Vreset (reset voltage for NVRS), respectively. In the operation mode, WE, $Ctrl_{y0}$ and $Ctrl_{y1}$ are set to "0" to turn off $PV_x$ and $PV_y$, and $Ctrl_{x0}$ and $Ctrl_{x1}$ are set to "1" to turn on a data transfer path, so that data inputs can be switched according to "ON"/"OFF" of 1T1R-NVSCs.

Figure 4D:
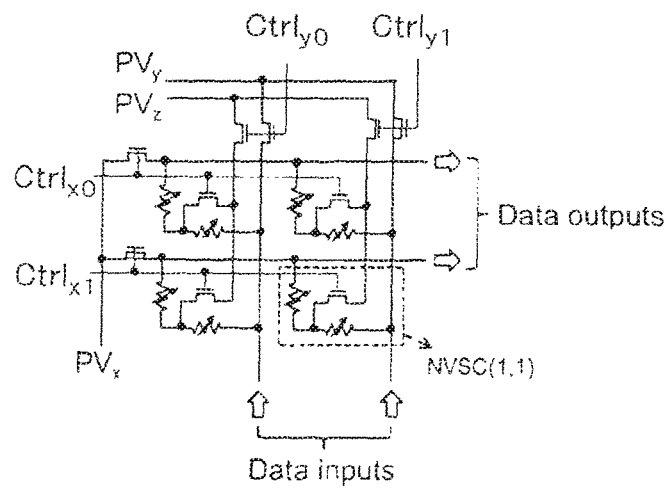
FIG. 4D illustrates a 1T2R-NVSC array.

To improve OFF-state reliability of the 1T1R-NVSC, 1T2R-NVSC has been introduced in U.S. Pat. No. 8,816, 312. As shown in FIG. 4B, two NVRSs are connected in series in the opposite direction, in which the two OFF-state NVRSs complementarily divide the voltage stress, greatly enlarging the OFF-state lifetime. NVRS count is increased twice in comparison with the 1T1R-NVSC, but the area of the device is not increased because the additional NVRS is stacked on the CMOS circuit. In the 1T2R-NVSC array shown in FIG. 4D, the common terminal of the two serially-connected NVRSs is connected to the source of a transistor whose gate is connected to a control signal $Ctrl_x$, and the drain is connected with the control signal $Ctrl_y$. The transistor works as a switch to access the selected 1T2R-NVSC and to isolate unselected 1T2R-NVSCs for high write reliability. Only when the transistor is switched ON, can the selected 1T2R-NVSC be configured. The disadvantage of the 1T2R-NVSC is that three programming voltages need to be configured, while only two programming voltages are necessary to configure the 1T1R-NVSC.

Next, the configuration and operation modes of the 1T2R-NVSC array will be discussed. The programming voltages $PV_x$, $PV_y$ and $PV_z$ are used to configure NVSCs as "ON" or "OFF". The control signals $Ctrl_x$ and $Ctrl_y$ determine the address of the NVSC to be configured. In the configuration mode, for example, in order to program NVSC (1, 1) as "ON", $PV_x$, $PV_y$ and $PV_z$ are set to Vset, Vset and Gnd, respectively. $Ctrl_{x1}$ and $Ctrl_{y1}$ are set to "1", and $Ctrl_{x0}$ and $Ctrl_{y0}$ are set to "0". Vset and Gnd are applied to the three terminals of the NVSC (1, 1) which can be configured as "ON". On the other hand, in order to program NVSC (1, 1) as "OFF", $PV_x$, $PV_y$ and $PV_z$ are set to Gnd, Gnd and Vreset, respectively. In the operation mode, all the $Ctrl_{x0}$, $Ctrl_{x1}$, $Ctrl_{y0}$ and $Ctrl_{y1}$ are set to "0", so that data inputs can be switched according to "ON"/"OFF" of 1T2R-NVSCs.

Embodiment 2

Next, a second embodiment according to the present invention will be presented. The present embodiment discloses a novel reconfigurable circuit using 1T1R-NVSCs.

Figure 5:
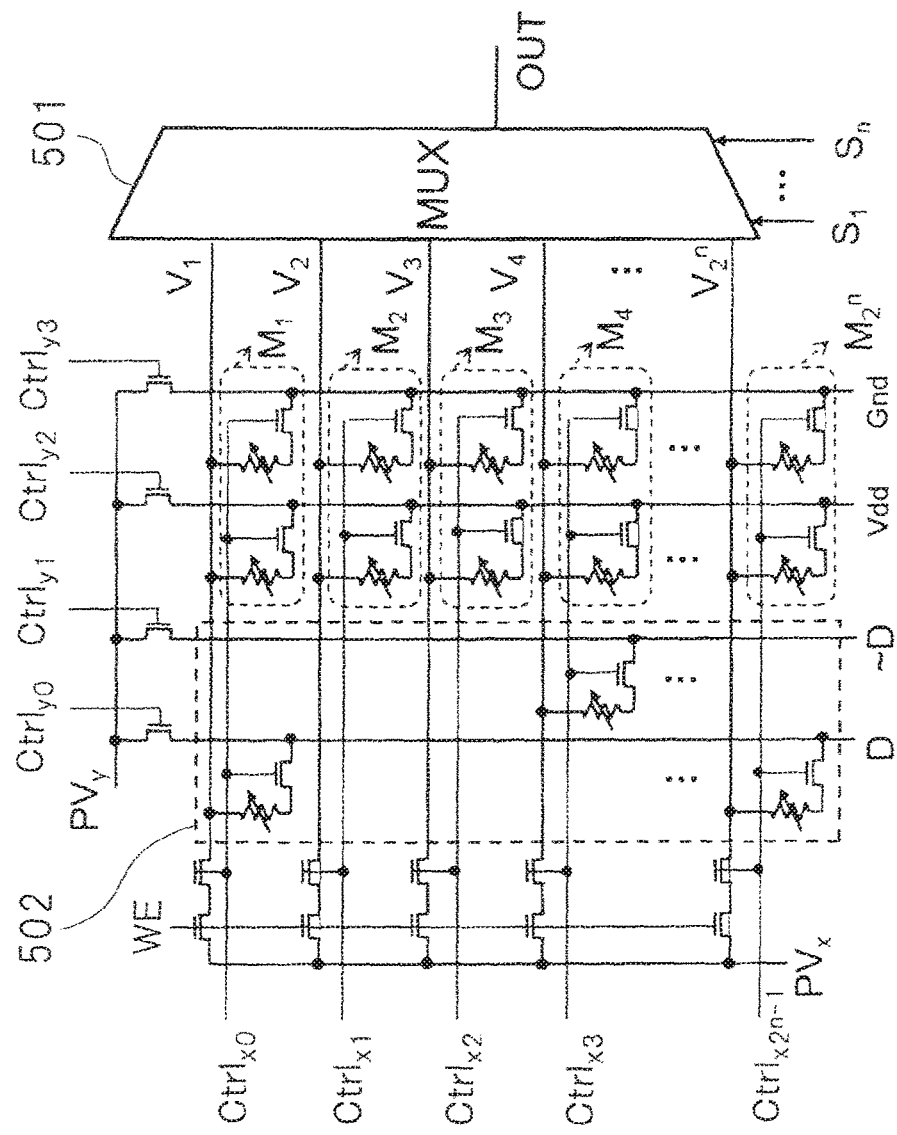
FIG. 5 illustrates a novel 1T1R-NVSC-based reconfigurable circuit implementing a LUT and "hard" circuit according to embodiment 1.

FIG. 5 illustrates a novel 1T1R-NVSC-based reconfigurable circuit implementing a LUT and "hard" circuit according to the exemplary embodiment. The novel 1T1R-NVSC-based reconfigurable circuit is composed of wires, 1T1R-NVSCs and a $2^n$:1 MUX 501, 1T1R-NVSCs constructs MUX input switch block 502, and memories $M_1, \ldots, M_{2^n}$. First wires are disposed in a first direction, while second wires are disposed in a second direction intersecting the first direction. Vdd, Gnd, data signal D, and data signal inverse ~D are applied to the first wires one-to-one, while the second wires are coupled to the input ports $V_1, V_2, \ldots, V_{2^n}$ of the MUX 501 one-to-one. A first group of the first wires are coupled to Vdd and Gnd, and a second group of the first wires are coupled to D and ~D.

At the crosspoints of the first group of the first wires and the second wires, 1T1R-NVSCs are fully arranged to construct memories $M_1, \ldots, M_{2^n}$ to provide Vdd, Gnd and high impedance states randomly whereas at the crosspoints of the second group of the first wires and the second wires, 1T1R-NVSCs are sparsely arranged to apply D/~D to the MUX 501 input ports according to dedicated "hard" circuit.

When Vdd or Gnd is selected as the input of the MUX 501, memories $M_1, \ldots, M_{2^n}$ are applied to the MUX 501, thus LUT can be realized. On the other hand, when D/~D is selected as the input of the MUX 501, a PTL "hard" circuit can be realized.

Figures 1A, 1B:
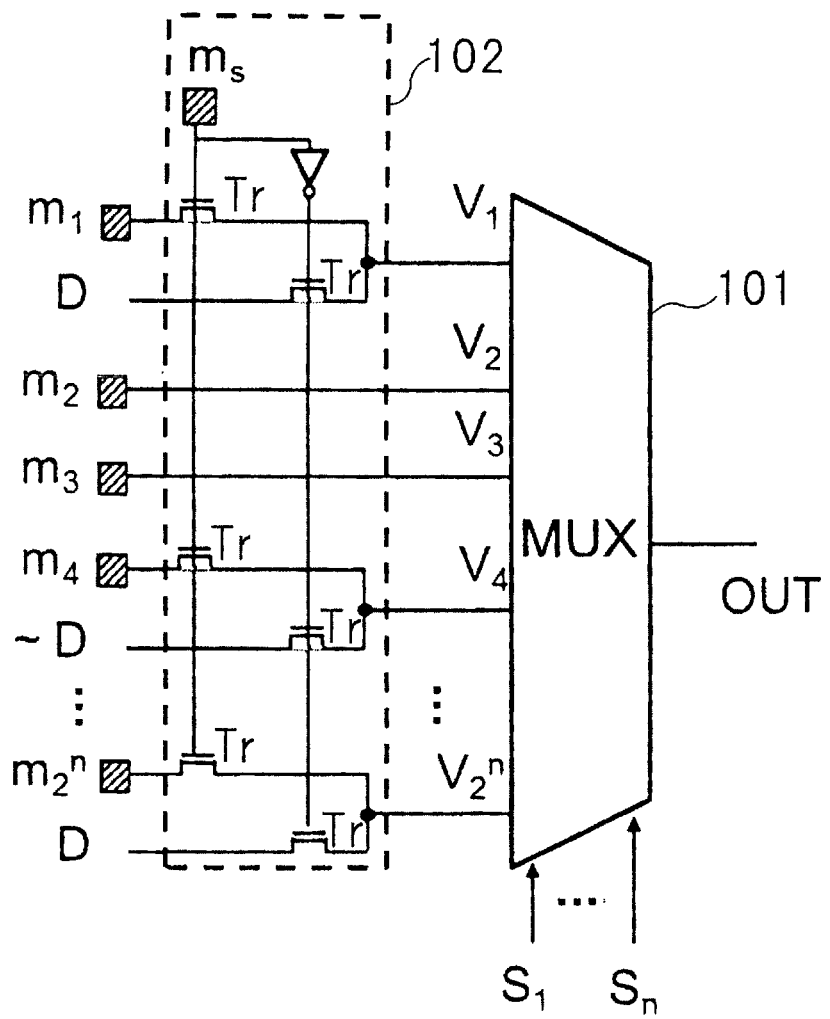
FIG. 1A illustrates a conventional reconfigurable circuit implementing a LUT and "hard" circuit.
FIG. 1B shows an output state of memory $M_n$ in FIG. 1A.

In comparison with the conventional reconfigurable circuit shown in FIG. 1A, the area of the MUX input switch block can be reduced, because all the NVRSs are stacked on the CMOS circuit and the transistor count is reduced by more than half in the present embodiment.

Figure 6:
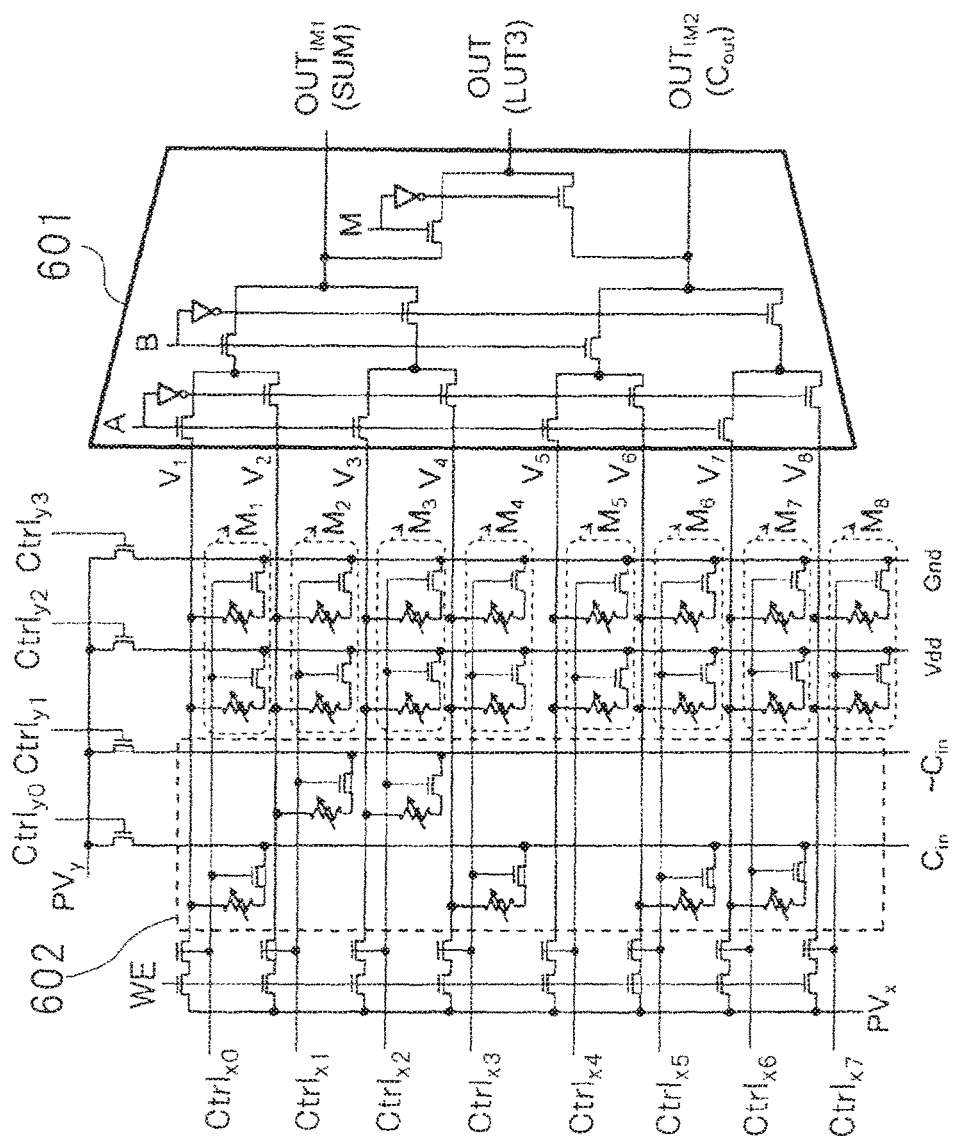
FIG. 6 illustrates a novel 1T1R-NVSC-based FA-type 3-input LUT implementing a 3-input LUT and the FA according to embodiment 2.

FIG. 6 illustrates a novel 1T1R-NVSC-based FA-type 3-input LUT to implement a 3-input LUT and the FA. The n defined in the first embodiment is set as 3 in the present embodiment. The "hard" circuit is set as the FA. 1T1R-NVSCs are arranged at the crosspoints $(C_{in}, V_1)$, $(\sim C_{in}, V_2)$, $(\sim C_{in}, V_3)$, $(C_{in}, V_4)$, $(C_{in}, V_6)$ and $(C_{in}, V_7)$ for implementation of the FA. In order to implement the FA, all the 1T1R-NVSCs in the MUX input switch block 602 are configured as "ON", the memory M5 is configured as the Vdd state, the memory M8 is configured as Gnd state, and the other memories are configured as the high impedance state. The $C_{in}$ and $\sim C_{in}$ are applied to the 8:1 MUX 601, and SUM and $C_{out}$ will be generated, simultaneously. On the other hand, in order to implement a 3-input LUT, all the 1T1R-NVSCs in the MUX input switch block are configured as the OFF state, and the memories $M_1, \ldots, M_8$ are configured as the Vdd or Gnd state randomly depending on the 3-variable function that is required.

In comparison with the conventional FA-type 3-input LUT shown in FIG. 2A, the area of the MUX input switch block 602 can be reduced in the novel 1T1R-NVSC-based FA-type 3-input LUT according to the present embodiment, because the NVRSs are stacked on CMOS circuit and the transistor count of the MUX input switch block is reduced by 66.7% (in case that $m_s$ in FIG. 2A is a SRAM composed of 6 transistors). Total transistor count is reduced by 29.5%.

Embodiment 3

Next, a third embodiment according to the present invention will be presented. The present embodiment discloses a novel select-transistor-shared 1T1R-NVSC-based FA-type 3-input LUT. Transistor count in the MUX input switch block can be further reduced.

Sharing the control signals $Ctrl_{y0}$ and $Ctrl_{y1}$ and sharing selected transistors in the MUX input switch block in order to further reduce the transistor count without reducing write reliability constitutes the difference between the second and third embodiment.

Figure 7:
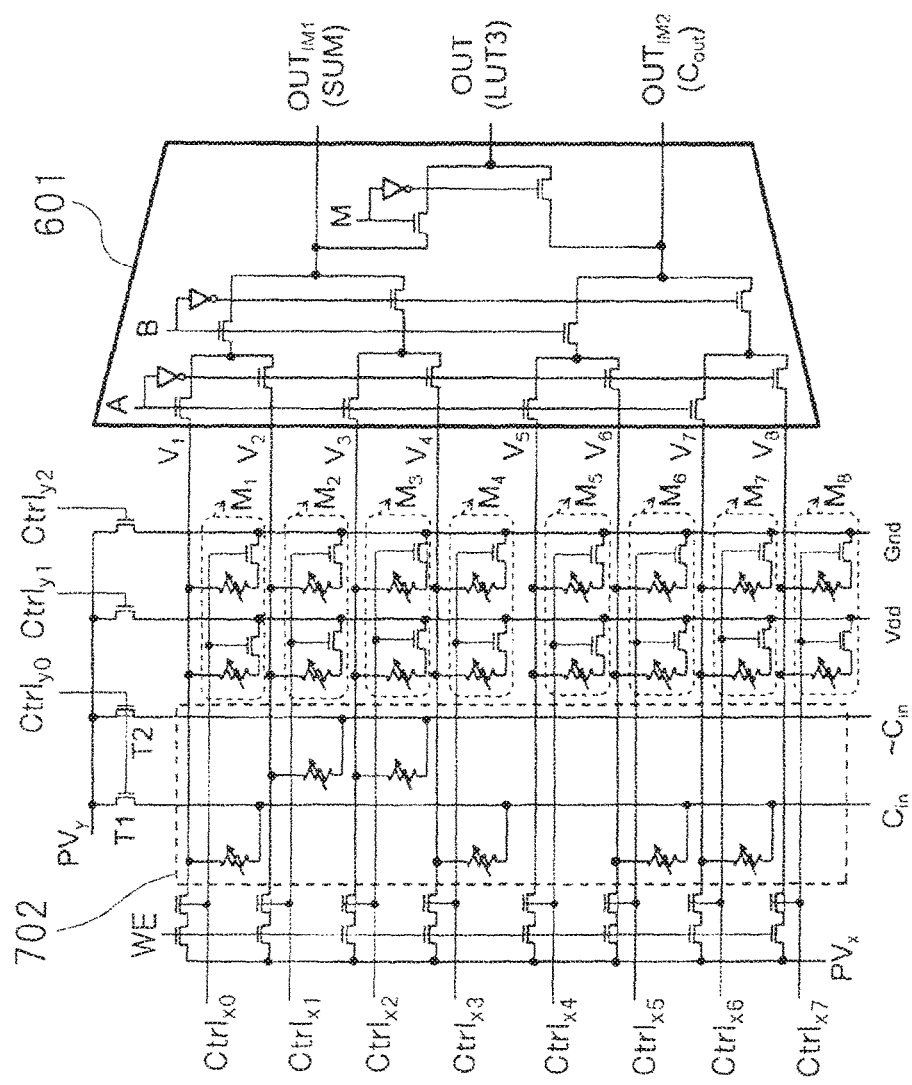
FIG. 7 illustrates a novel select-transistor-shared 1T1R-NVSC-based FA-type 3-input LUT implementing a 3-input LUT and the FA according to embodiment 3.

FIG. 7 illustrates the novel select-transistor-shared 1T1R-NVSC-based FA-type 3-input LUT implementing a 3-input LUT and the FA. As mentioned in embodiment 2, the 1T1R-NVSCs in the memories are configured as "ON" or "OFF" randomly according to the function that is required. Write disturbance problems may occur when there is no isolation between NVRSs. However, all the 1T1R-NVSCs in the MUX input switch block 702 are configured to be in the same "ON" or "OFF" state, so that it is not necessary to isolate the NVRSs. Therefore, the control signal $Ctrl_{y0}$ and select transistors T1 and T2 are shared by the 6 NVRSs in the MUX input switch block 702 that is to be configured. There are two advantages, one is area reduction, and the other one is write cycle count reduction.

Total transistor count of the select-transistor-shared 1T1R-NVSC-based FA-type 3-input LUT is reduced by 9.7% in comparison with that of the 1T1R-NVSC-based FA-type 3-input LUT shown in FIG. 6 according to the second embodiment.

Embodiment 4

Next, a forth embodiment according to the present invention will be presented. The present embodiment discloses a the reconfigurable circuit using 1T2R-NVSCs.

Figure 8:
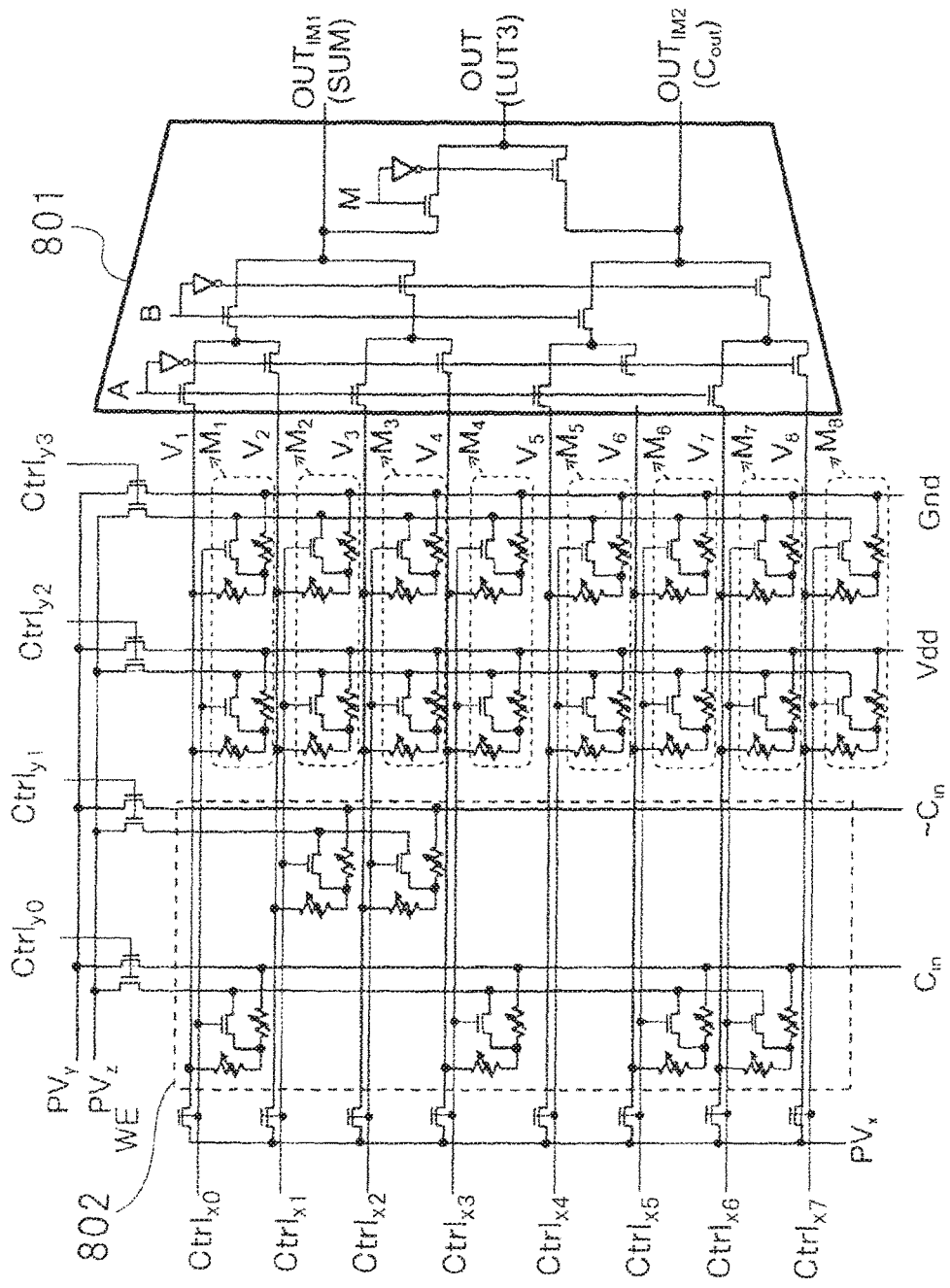
FIG. 8 illustrates a novel 1T2R-NVSC-based FA-type 3-input LUT implementing a 3-input LUT and the FA according to embodiment 4.

FIG. 8 illustrates a novel 1T2R-NVSC-based FA-type 3-input LUT to implement a 3-input LUT and the FA. 1T2R-NVSCs are arranged at the crosspoints $(C_{in}, V_1)$, $(\sim C_{in}, V_2)$, $(\sim C_{in}, V_3)$, $(C_{in}, V_4)$, $(C_{in}, V_6)$ and $(C_{in}, V_7)$ to implement the FA. In order to implement the FA, all the 1T2R-NVSCs in the MUX input switch block are configured as "ON", memory M5 is configured as a Vdd state, memory M8 is configured as a Gnd state, and the other memories are configured as a high impedance state. The $C_{in}$ and $\sim C_{in}$ are applied to the 8:1 MUX 801, and SUM and $C_{out}$ will be generated, simultaneously. On the other hand, in order to implement a 3-input LUT, all the 1T2R-NVSCs in the MUX input switch block 802 are configured as the OFF state, and the memories $M_1, \ldots, M_8$ are configured as the Vdd or the Gnd state randomly depending on the 3-variable function we need.

In comparison with the conventional FA-type 3-input LUT shown in FIG. 2, the area of the MUX input switch block 802 can be reduced in the novel 1T2R-NVSC-based FA-type 3-input LUT according to the present embodiment, because the NVRSs are stacked on a CMOS circuit and the transistor count of the MUX input switch block 802 is reduced by 66.7% (in case that $m_s$ in FIG. 2 is a SRAM composed of 6 transistors). Total transistor count is reduced by 34.1%.

Figure 9:
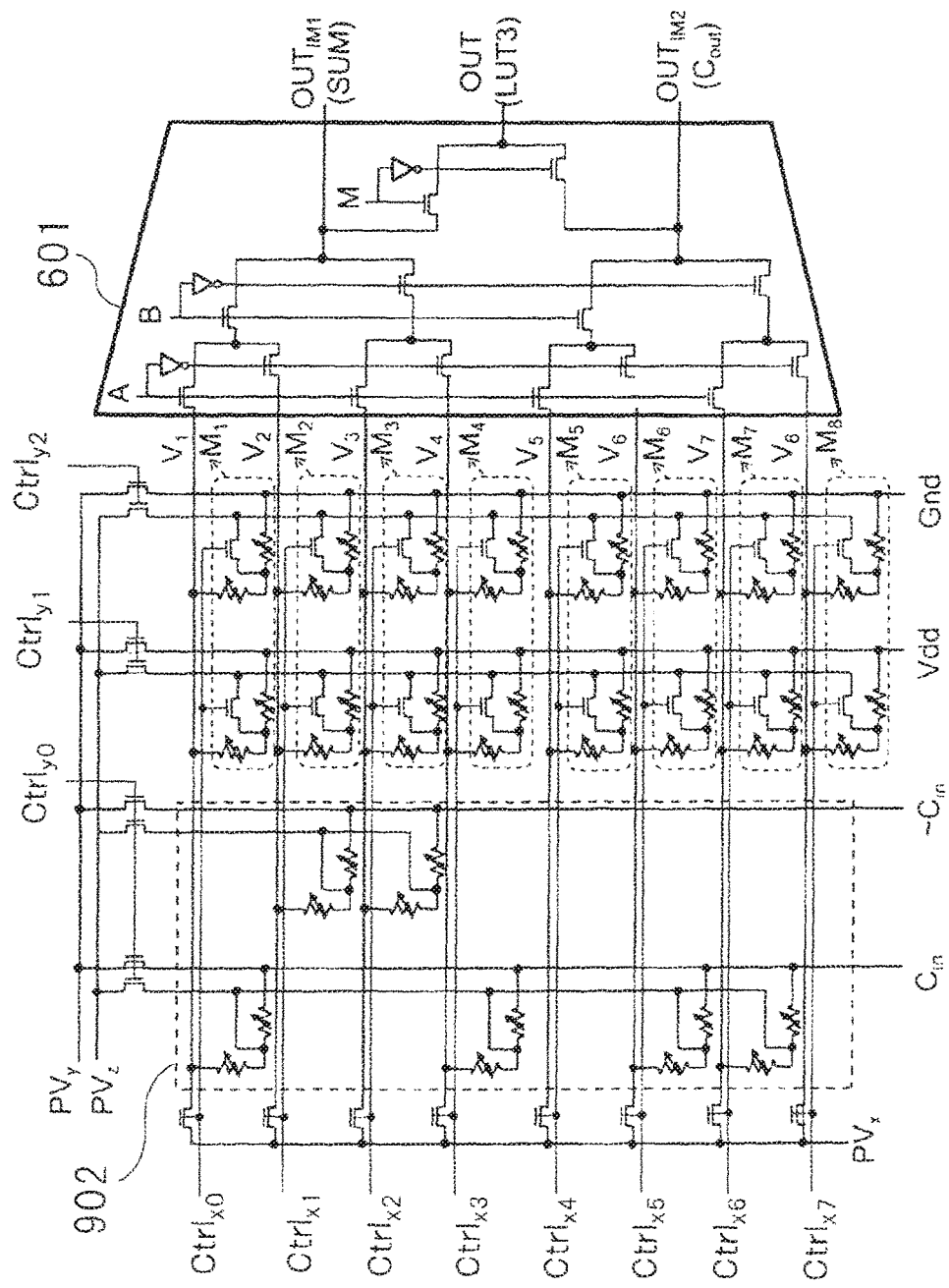
FIG. 9 illustrates a novel select-transistor-shared 1T2R-NVSC-based FA-type 3-input LUT implementing a 3-input LUT and the FA according to embodiment 4.

FIG. 9 illustrates a novel select-transistor-shared 1T2R-NVSC-based FA-type 3-input LUT implementing a 3-input LUT and the FA. The 1T2R-NVSCs in the memories are configured as "ON" or "OFF" randomly according to the function that is required. Write disturbance problem may occur when there is no isolation between these NVRSs. However, all the 1T2R-NVSCs in the MUX input switch block 902 are configured to be in the same "ON" or "OFF" state, so that isolation between the NVRSs are not needed.

Therefore, the control signal $Ctrl_{y0}$ and select transistors T1, T2, T3 and T4 are shared by the 6 NVRSs in the MUX input switch block 902 that is to be configured. There are two advantages, one is area reduction, and the other one is write cycle count reduction. In the 1T2R-NVSC-based FA-type 3-input LUT shown in FIG. 8 according to the second embodiment, 6 cycles are necessary to configure the 6 NVRSs in the MUX input switch block 902, whereas in the select-transistor-shared 1T2R-NVSC-based FA-type 3-input LUT, only one cycle is necessary to configure all the 6 NVRSs.

Total transistor count of the select-transistor-shared 1T2R-NVSC-based FA-type 3-input LUT is reduced by 10.3% in comparison with that of the 1T2R-NVSC-based FA-type 3-input LUT shown in FIG. 8. Total transistor count of the select-transistor-shared 1T2R-NVSC-based FA-type 3-input LUT is reduced by 7.1% in comparison with that of the select-transistor-shared 1T1R-NVSC-based FA-type 3-input LUT shown in FIG. 7.

Embodiment 5

Next, a fifth embodiment according to the present invention will be presented. The present embodiment discloses a novel LB using novel NVSC-based FA-type 3-input LUTs. The novel NVSC-based FA-type 3-input LUT can be the novel 1T1R-NVSC-based FA-type 3-input LUT according to embodiment 2, the novel select-transistor-shared 1T1R-NVSC-based FA-type 3-input LUT according to embodiment 3, the novel 1T2R-NVSC-based FA-type 3-input LUT according to embodiment 4, or the novel select-transistor-shared 1T2R-NVSC-based FA-type 3-input LUT according to embodiment 4.

Figure 11:
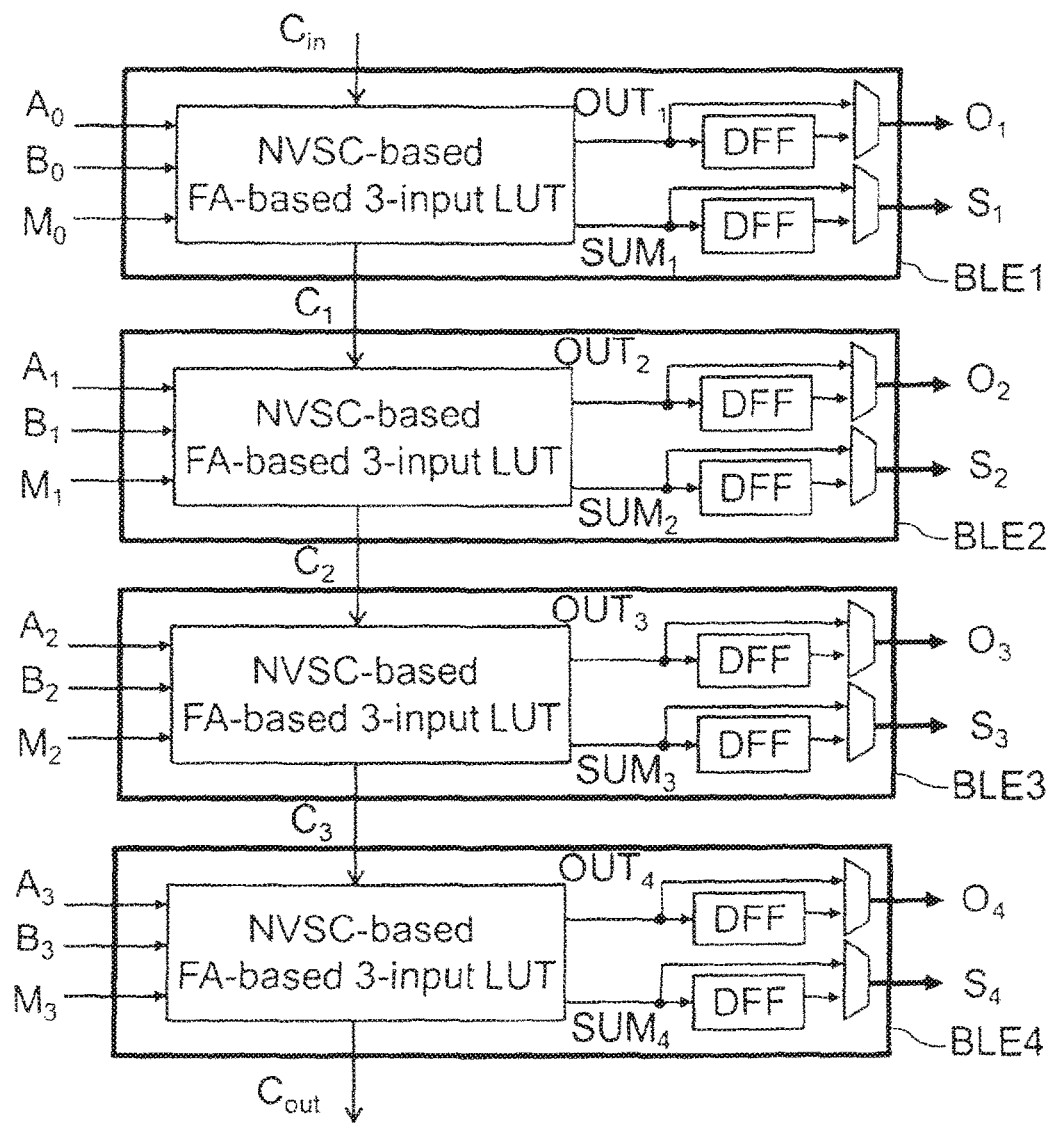
FIG. 11 illustrates a novel logic block (LB) using the novel NVSC-based FA-type 3-input LUTs according to embodiment 5.

FIG. 11 illustrates the novel LB using the novel NVSC-based FA-type 3-input LUTs to implement a 4-bit adder and 4 3-input LUTs. The novel LB is composed of 4 basic logic elements (BLEs). The BLE is composed of one novel NVSC-based FA-type 3-input LUT, two D-flip-flops (DFFs) and two MUXs. The novel NVSC-based FA-type 3-input LUT is used to implement a 1-bit adder and a 3-input LUT. The DFF is used to store the result of the novel NVSC-based FA-type 3-input LUT. The MUX is used to select the result stored in the DFF or the result of the novel NVSC-based FA-type 3-input LUT as output of the BLE.

In a logic mode, BLE1, BLE2, BLE3 and BLE4 are used to realize various functions of data inputs ($A_0$, $B_0$, $M_0$), ($A_1$, $B_1$, $M_1$), ($A_2$, $B_2$, $M_2$), and ($A_3$, $B_3$, $M_3$), respectively. To implement a 4-bit adder of data inputs A and B, ($A_0$, $B_0$), ($A_1$, $B_1$), ($A_2$, $B_2$), and ($A_3$, $B_3$) are applied to the first novel NVSC-based FA-type 3-input LUT in BLE1, the second novel NVSC-based FA-type 3-input LUT in BLE2, the third novel NVSC-based FA-type 3-input LUT in BLE3, and the forth novel NVSC-based FA-type 3-input LUT in BLE4, respectively. A carry-in signal $C_{in}$ is applied to the first novel NVSC-based FA-type 3-input LUT in BLE1 whose carry-out signal $C_1$ is directly applied to the second novel NVSC-based FA-type 3-input LUT in BLE2. Then the carry-out signal $C_2$ of the second novel NVSC-based FA-type 3-input LUT in BLE2 is directly applied to the third novel NVSC-based FA-type 3-input LUT in BLE3 whose carry-out signal $C_3$ is directly applied to the forth novel NVSC-based FA-type 3-input LUT in BLE4. Finally, the forth novel NVSC-based FA-type 3-input LUT in BLE4 generates the carry-out signal $C_{OUT}$.

This embodiment does not limit adding to four-bit numbers because the LB is formed as part of an array of LBs, and higher-order bits may be handled in LBs connected above the shown CLB.

It is apparent that the present invention is not limited to the above embodiments, but may be modified and changed without departing from the scope and spirit of the invention.

What is claimed is:
1. A reconfigurable circuit comprising:
three first wires coupled to a power line, a ground line, and either data line or data inverse line one-to-one;
a second wire connected to one of inputs in a multiplexer; and
switch cells each of which includes a first transistor and through which the said first wires are connected to said second wire, wherein
every said switch cell connected to said first wires coupled to the said power line and ground line includes a first non-volatile resistive switch that has two variable states of "ON" and "OFF",
a first terminal of said first non-volatile resistive switch is connected to said second wire;
a second terminal of said first non-volatile resistive switch is connected to a source terminal of said first transistor whose drain terminal is connected to said first wire;
gate terminals of said first transistors in all switch cells on said second wire are connected to a first control signal line.
2. The reconfigurable circuit according to claim 1, wherein
more than two said second wires are connected to said three first wires through said switch cells.
3. The reconfigurable circuit according to claim 1, further comprising:
another second wire that is connected to one of said inputs in said multiplexer: and said second wire that is connected only to said power and ground lines through said switch cells.
4. The reconfigurable circuit according to claim 1, wherein
every said switch cell connected with the said first wire coupled to the said data line or data inverse line includes a second non-volatile resistive switch that has two variable states of "ON" and "OFF",
a first terminal of said second non-volatile resistive switch is connected to said second wire;
a second terminal of said second non-volatile resistive switch is connected to said source terminal of said first transistor whose drain terminal is connected to said first wire.
5. The reconfigurable circuit according to claim 4, wherein
every said first wire is connected to a source terminal of a second transistor whose gate terminal is coupled to a second control signal line,
all said drain terminals of second transistors are connected to a first program voltage line,
every said second wire is connected to a source terminal of a third transistor whose gate terminal is coupled to said first control signal line,
drain terminal of said third transistor is connected to a source terminal of a fourth transistor,
all the gate terminals of said fourth transistors are connected to a write enable signal line, and
all the drain terminals of said fourth transistors are connected to a second program voltage line.

6. The reconfigurable circuit according to claim 1, wherein
every said switch cell connected with the said first wire coupled to the said data line or data inverse line includes a second non-volatile resistive switch, and
a first terminal of said second non-volatile resistive switch is connected to said first wire while a second terminal of said second non-volatile resistive switch is connected to said second wire.

7. The reconfigurable circuit according to claim 6, wherein
every said first wire coupled to the said data line or data inverse line is connected to a source terminal of a second transistor,
all the gate terminals of the said second transistors are connected to a common second control signal line,
every said first wire coupled to said power line and ground line is connected to a source terminal of a third transistor whose gate terminal is coupled to a third control signal line,
all the drain terminals of the said second transistors and said third transistors are connected to a first program voltage line,
every said second wire is connected to a source terminal of a fourth transistor whose gate terminal is coupled to the said first control signal, and a drain terminal of said fourth transistor is connected to a source terminal of a fifth transistor, and
all the gate terminals of said fifth transistors are connected to a write enable signal line;
all the drain terminals of said fifth transistors are connected to a second program voltage line.

8. The reconfigurable circuit according to claim 1, wherein
ON/OFF resistance ratio of said non-volatile resistive switch is over $10^4$.

9. The reconfigurable circuit according to claim 1, wherein
every said non-volatile resistive switch comprises a metal oxide resistance change device or a solid electrolyte resistance change device.

10. A reconfigurable circuit comprising:
three first wires coupled to a power line, a ground line, and either data line or data inverse line one-to-one;
a second wire connected to one of inputs in a multiplexer;
switch cells through which the said first wires are connected to said second wire,
wherein
every said switch cell includes first and second non-volatile resistive switches and a first transistor, each of said first and second non-volatile resistive switch having two variable states of "ON" and "OFF",
a first terminal of said first non-volatile resistive switch is connected to said second wire,
a first terminal of said second non-volatile resistive switch is connected to the said first wire,
a source of said first transistor is connected to a second terminal of said first non-volatile resistive switch as well as a second terminal of said second non-volatile resistive switch, and
the gate terminals of said first transistors in all switch cells on said second wires are connected to a first control signal line.

11. The reconfigurable circuit according to claim 10, wherein
in said switch cells on a common said first wire, all the drain terminals of said first transistor are connected to a source terminal of a second transistor whose gate terminal is coupled to a second control signal line, and the common said first wire is connected to a source terminal of a third transistor whose gate terminal is coupled to said second control signal line, and all the drain terminals of said second transistors are connected to a first program voltage line, and all the drain terminals of said third transistors are connected to a second program voltage line, and
every said second wire is connected to a source terminal of a fourth transistor whose gate terminal is coupled to said first control signal, and all the drain terminals of said fourth transistors are connected to a third program voltage line.

12. A reconfigurable circuit comprising
three first wires coupled to a power line, a ground line, and either data line or data inverse line one-to-one;
a second wire connected to one of inputs in a multiplexer;
switch cells through which the said first wires are connected to said second wire,
wherein
every said switch cell connected to said first wires coupled to said data line or data inverse line includes first and second non-volatile resistive switches, each of said first and second non-volatile resistive switch having two variable states of "ON" and "OFF", wherein
a first terminal of said first non-volatile resistive switch is connected to said first wire,
a first terminal of said second non-volatile resistive switch is connected to said second wire; and
a second terminal of said first non-volatile resistive switch is connected to a second terminal of said second non-volatile resistive switch,
every said nonvolatile switch cell connected to said first wires coupled to said power line and a ground line includes third and fourth non-volatile resistive switches and a first transistor, each of said third and fourth non-volatile resistive switch having two variable states of "ON" and "OFF", wherein
a first terminal of said third non-volatile resistive switch is connected to said first wire,
a first terminal of a said fourth non-volatile resistive switch is connected to said second wire, and
a source of said first transistor is connected to a second terminal of said third non-volatile resistive switch as well as a second terminal of said fourth non-volatile resistive switch, and
all the gate terminals of said first transistors in switch cells on one of said second wires are connected to a first control signal line.

13. The reconfigurable circuit according to claim 12, wherein
in said switch cells on a common said first wire coupled to said data line or data inverse line, all said second terminals of said first non-volatile resistive switches are connected to a source terminal of a second transistor, and every said first wire coupled to said data input line or data inverse line is connected to a source terminal of a third transistor, and all the gate terminals of said second transistors and the third transistors are connected to a common second control signal;
in said switch cells on a common said first wire coupled to said power line and a ground line, all the drain terminals of first transistors are connected to source terminal of a fourth transistor whose gate terminal is coupled to a third control signal line, and said common first wire coupled to said power line and a ground line are connected to a source terminal of a fifth transistor whose gate terminal is coupled to said third control signal line;

all the drain terminals of said second and fourth transistors are connected to a first program voltage line, and all the drain terminals of said third and fifth transistors are connected to a second program voltage line;

every said second wire is connected to a source terminal of a sixth transistor whose gate terminal is coupled to said first control signal line, and all the drain terminals of the said sixth transistors are connected to a third program voltage.

* * * * *